United States Patent
Nakatani

(10) Patent No.: US 8,412,983 B2
(45) Date of Patent: Apr. 2, 2013

(54) MEMORY TEST CIRCUIT, SEMICONDUCTOR INTEGRATED CIRCUIT, AND MEMORY TEST METHOD

(75) Inventor: Keigo Nakatani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 703 days.

(21) Appl. No.: 12/585,898

(22) Filed: Sep. 28, 2009

(65) Prior Publication Data

US 2010/0023809 A1 Jan. 28, 2010

Related U.S. Application Data

(63) Continuation of application No. PCT/JP2007/056971, filed on Mar. 29, 2007.

(51) Int. Cl.
*G06F 11/00* (2006.01)
(52) U.S. Cl. .................. 714/30; 714/25; 714/42; 714/48
(58) Field of Classification Search .................... 714/30, 714/25, 48, 42
See application file for complete search history.

(56) References Cited

U.S. PATENT DOCUMENTS

| 6,314,536 | B1 | 11/2001 | Kurosaki |
| 2006/0107142 | A1* | 5/2006 | Inoue ............................ 714/726 |
| 2006/0224923 | A1* | 10/2006 | Tsukishiro ..................... 714/30 |

FOREIGN PATENT DOCUMENTS

| EP | 0 263 312 | 4/1988 |
| JP | 63-066798 | 3/1988 |
| JP | 64-72399 | 3/1989 |
| JP | 01-199395 | 8/1989 |
| JP | 1-308978 | 12/1989 |
| JP | 05-334888 | 12/1993 |
| JP | 6-28896 | 2/1994 |
| JP | 6-109812 | 4/1994 |
| JP | 06-119800 | 4/1994 |
| JP | 9-15305 | 1/1997 |
| JP | 11-328995 | 11/1999 |
| JP | 2000-156098 | 6/2000 |

OTHER PUBLICATIONS

International Search Report for PCT/JP2007/056971, mailed Jun. 12, 2007.
Japanese Office Action for corresponding Japanese Application 2009-507378; mailed Jan. 11, 2011.

* cited by examiner

*Primary Examiner* — Scott Baderman
*Assistant Examiner* — Sarai Butler
(74) *Attorney, Agent, or Firm* — Staas & Halsey LLP

(57) ABSTRACT

A memory test circuit includes a counter circuit that outputs a set signal that is set to the first set value or the second set value alternately in a cycle of the clock signal, an OR circuit that calculates a logical sum of the set signal and the input signal each time when the set signal is output from the counter circuit and outputs a control signal indicating the logical sum of the set signal and the input signal, and a test pattern generation circuit that generates the test pattern for causing the memory to operate in each first cycle if a set value of the control signal is the first set value, or generates the test pattern for causing the memory to operate in each second cycle if the set value of the control signal is the second set value.

8 Claims, 4 Drawing Sheets

MEMORY TEST CIRCUIT, SEMICONDUCTOR INTEGRATED CIRCUIT, AND MEMORY TEST METHOD

CROSS-REFERENCE TO RELATED APPLICATION(S)

This application is a continuation of International Application No. PCT/JP2007/056971, filed on Mar. 29, 2007, the entire contents of which are incorporated herein by reference.

FIELD

The embodiment discussed herein is directed to a memory test circuit that generates a predetermined test pattern and tests a memory by causing the memory to operate in accordance with the test pattern, a semiconductor integrated circuit, and a memory test method.

BACKGROUND

One of conventional design technologies for testability, which facilitate tests on semiconductor integrated circuits (for example, LSI (Large Scale Integrated-circuit)), is a technology called BIST (Built-In Self Test). BIST is a technology that embeds in a semiconductor chip a self-diagnostic test circuit that generates and outputs a test pattern and performs a comparison of test results.

BIST includes a logic BIST in which logic circuits in semiconductor integrated circuits are under test and a RAM-BIST (also referred to as "memory BIST" or "RBIST") in which RAM (Random Access Memory) blocks are under test.

The RAM-BIST is a technique that embeds in a chip a RAM-BIST circuit, which includes a pattern generating circuit for generating test patterns in accordance with a predetermined program, an address generating circuit for generating a storage address for data to be read from or written to upon testing; and a result comparing circuit for comparing data read from a RAM with an expected value, and the RAM-BIST is widely used in the design of LSI circuits with a cache memory.

Clock frequencies of currently-available chips are now of the order of a GHz. This makes it difficult for a RAM with a large number of word lines to operate in one cycle (i.e., the cycle of a clock signal). For this reason, a 1τ-RAM with a small number of words that operates in one cycle and a 2τ-RAM with a large number of words that operates in two cycles are mounted on a chip.

However, to generate test patterns for their respective 1τ-RAM and the 2τ-RAM by the same method as that of a conventional RAM-BIST circuit, it is necessary to prepare, as a program used in the pattern generating circuit, a program being able to generate two patterns: a pattern for causing a RAM to operate in one cycle and a pattern for causing a RAM to operate in two cycles. In this case, the area for storing the program requires double the number of words compared with that required by a conventional RAM-BIST circuit, resulting in an increase in the scale of the RAM-BIST circuit.

[Patent Document] Japanese Laid-open Patent Publication No. 06-28896

SUMMARY

According to an aspect of an embodiment of the invention, a memory test circuit for receiving an input signal that is set to a first set value or a second set value and a clock signal that is generated in a predetermined cycle to test a memory, includes a counter circuit that outputs a set signal that is set to the first set value and a second set value alternately in a cycle of the clock signal, an OR circuit that calculates a logical sum of the set signal and the input signal each time when the set signal is output from the counter circuit and outputs a control signal indicating the logical sum of the set signal and the input signal and a test pattern generation circuit that generates the test pattern for causing the memory to operate in each first cycle if a set value of the control signal is the first set value, or generates the test pattern for causing the memory to operate in each second cycle if the set value of the control signal is the second set value.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Preferred embodiments of the present invention will be explained with reference to the accompanying drawings.

Figure 1:
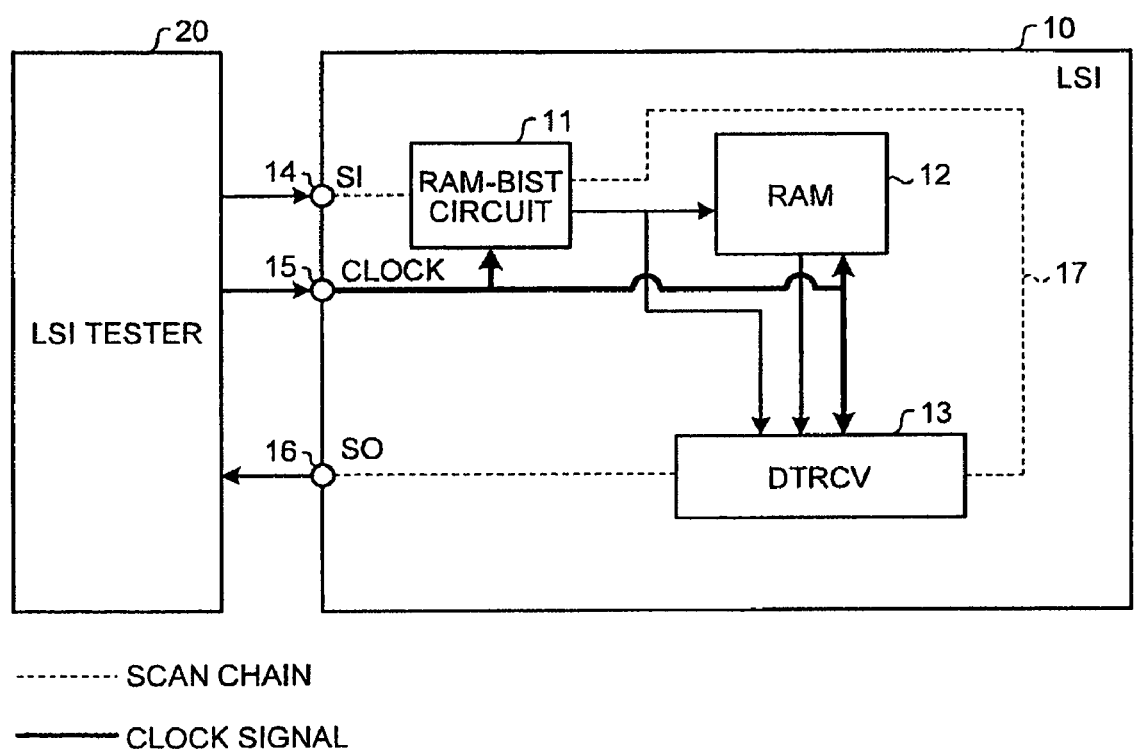
FIG. 1 is a diagram illustrating a memory test method using a RAM-BIST circuit according to an embodiment of the present invention.

A memory test method using a RAM-BIST circuit according to an embodiment of the present invention will be explained. FIG. 1 is a diagram illustrating the memory test method using a RAM-BIST circuit according to the embodiment. FIG. 1 depicts an LSI 10, which is a semiconductor integrated circuit; and an LSI tester 20 that controls a test.

As illustrated in FIG. 1, the LSI 10 includes a RAM-BIST circuit 11; a DTRCV (data receiver) 13; an SI (Scan-In) terminal 14; a clock terminal 15; and an SO terminal 16. The RAM-BIST circuit 11, the DTRCV 13, and the So terminal 16 are linked through a scan chain 17. The Clock terminal 15 is connected to the RAM-BIST circuit 11, a RAM 12, and the DTRCV 13.

The RAM-BIST circuit 11 includes a circuit for generating a test pattern and a circuit for generating an address. The DTRCV 13 is a circuit that includes a circuit that performs a comparison to obtain a test result and a latch circuit for storing a test result.

The SI terminal 14 is a terminal through which a scan-in signal from the LSI tester 20 is input. The Clock terminal 15 is a terminal through which a clock signal from the LSI tester 20 is input. The SO terminal 16 is a terminal through which a SO (Scan-Out) signal is output to the LSI tester 20.

In order to test the LSI 10, the LSI tester 20 inputs data that is an initial value to the LSI 10 through the SI terminal 14. Each of the RAM-BIST circuit 11 and the DTRCV 13 that receive the data through the scan chain 17 sets the data as an initial value.

Subsequently, the LSI tester 20 inputs a clock signal to the LSI 10 through the Clock terminal 15. The RAM-BIST circuit 11 that receives the clock signal generates a test pattern and an address, using a predetermined program, and then writes test data in accordance with the test pattern and the address in the RAM 12. Simultaneously, the RAM-BIST circuit 11 transmits the identical test data as an expected-value data to the DTRCV 13.

After the test data is written in the RAM 12, the DTRCV 13 reads the test data and compares the test data with the data that is transmitted as an expected-value data to determine whether the test data is acceptable. The DTRCV 13 then stores a determination result as a test result in the latch circuit. The LSI tester 20 acquires the test result, which is stored in the DTRCV 13, through the SO terminal 16, and the test is completed.

If the RAM 12 to be tested includes a 1τ-RAM and a 2τ-RAM, the RAM-BIST circuit 11 needs to change the test pattern depending on the RAM in the above-described testing. Specifically, when the 1τ-RAM is tested, a test pattern for writing test data in each one cycle is necessary. In contrast, when the 2τ-RAM is tested, a test pattern for writing test data in each two cycles is necessary.

The RAM-BIST circuit 11 according to the embodiment generates test patterns in different cycles, using one program to generate a predetermined pattern. Thus, each memory can be tested without increasing the circuit scale.

Figure 2:
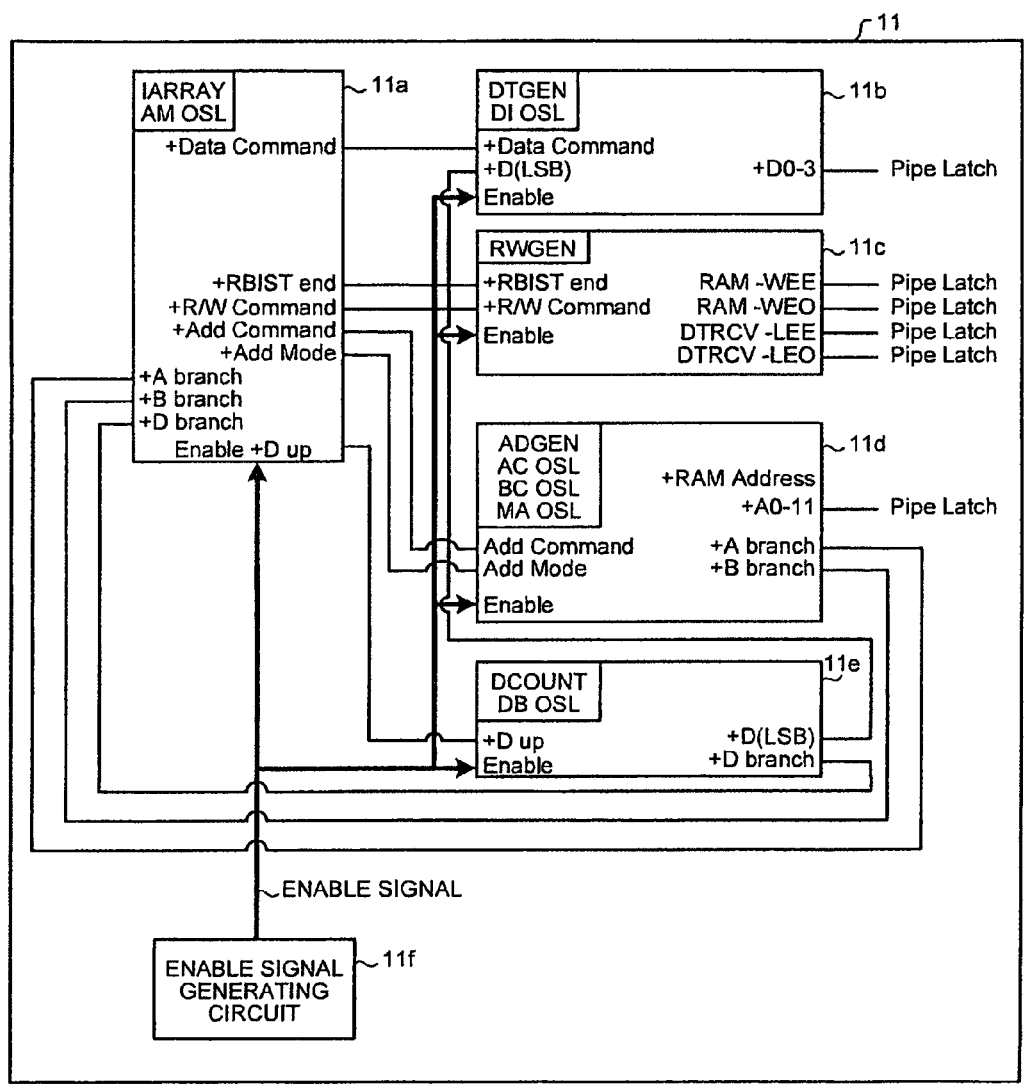
FIG. 2 is a block diagram of a configuration of the RAM-BIST circuit according to the embodiment.

The configuration of the RAM-BIST circuit 11 according to the embodiment will be explained. FIG. 2 is a block diagram of the configuration of the RAM-BIST circuit 11 according to the embodiment. As illustrated in FIG. 2, the RAM-BIST circuit 11 includes an IARRAY 11a, a DTGEN 11b, a RWGEN 11c, an ADGEN 11d, a DCOUNT (D-counter) 11e, and an enable signal generating circuit 11f.

The IARRAY 11a is a circuit that stores therein the program for generating patterns. When a "High" enable signal is output from the enable signal generating circuit 11f, which will be described, the IARRAY 11a generates a test pattern based on the predetermined program and the repetition number that the DCOUNT 11e generates.

The DTGEN 11b is a circuit that generates test data to be written in the RAM 12 and an expected value to be compared with the test data that is read from the RAM 12. When a "High" enable signal is output from the enable signal generating circuit 11f, the DTGEN 11b generates test data and expected-value data in accordance with the test pattern, which is generated by the IARRAY 11a, and the data, which is generated by the DCOUNT 11e. The DTGEN 11b then outputs the test data to the RAM 12 and outputs the expected-value data to the DTRCV 13.

The RWGEN 11c is a circuit that generates a control signal to be input to the RAM 12 and a control signal to be input to the DTRCV 13. When a "High" enable signal is output from the enable signal generating circuit 11f, the RWGEN 11c generates a control signal as an instruction for writing test data on the basis of the test pattern, which is generated by the IARRAY 11a, and then outputs the control signal to the RAM 12. Simultaneously, the RWGEN 11c generates a control signal as an instruction for determining test data by compassion and outputs the control signal to the DTRCV 13.

The ADGEN 11d is a circuit that generates an address to which test data is to be stored. When a "High" enable signal is output from the enable signal generating circuit 11f, the ADGEN 11d generates an address in accordance with the test pattern generated by the IARRAY 11a, using two counters (A/B), and outputs the address to the RAM 12.

The DCOUNT 11e is a circuit that generates a program repetition number and data based on which test data is generated. When a "High" enable signal is output from the enable signal generating circuit 11f, the DCOUNT 11e generates a program repetition number and outputs the program repetition number to the IARRAY 11a. Simultaneously, the DCOUNT 11e generates data based on which test data is generated and outputs the data to the DTGEN 11b.

The enable signal generating circuit 11f is a circuit that receives a signal that is output from a setting latch 11a, which will be described, and a signal that is output from a counter 11fb, which will be described, and generates an enable signal as an instructing for the IARRAY 11a, the DTGEN 11b, the RWGEN 11c, the ADGEN 11d, and the DCOUNT 11e to operate.

Figure 3:
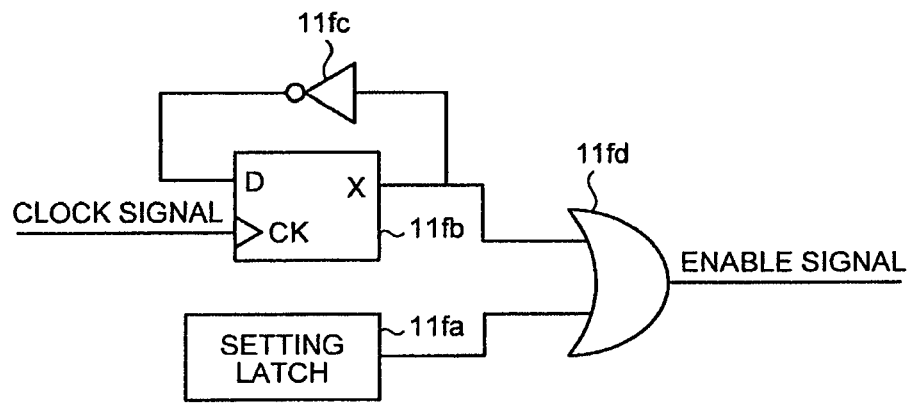
FIG. 3 is an example circuit diagram of a circuit that achieves an enable signal generating circuit.

An example of the circuit that achieves the enable signal generating circuit 11f will be explained. FIG. 3 is an example circuit diagram of the circuit that achieves the enable signal generating circuit 11f. As illustrated in FIG. 3, the enable signal generating circuit 11f includes the setting latch 11fa, the counter 11fb, an NOT circuit 11fc, and an OR circuit 11fd.

The setting latch 11fa retains a "High" or "Low" value as a set value and outputs the value to the OR circuit 11fd. When the 1τ-RAM is tested, "High" is set in the setting latch 11fa. When 2τ-RAM is tested, "Low" is set in the setting latch 11fa.

The counter 11fb is a circuit that outputs a "High" and "Low" signal alternately to the OR circuit 11fd in each cycle of a clock signal. Specifically, when a clock signal is externally input, the counter 11fb outputs a "High" and "Low" signal alternately to the NOT circuit 11fc and the OR circuit 11fd in each cycle of an input clock signal.

The value of the signal that is output to the NOT circuit 11fc is inverted by the NOT circuit 11fc and the signal is then input to the counter 11fb. When the signal is input, the counter 11fb outputs the signal to the NOT circuit 11fc and the OR circuit 11fd. By performing this operation in each cycle of a clock signal, the counter circuit can output a "High" and "Low" signal alternately to the OR circuit 11fd in each cycle of a clock signal.

The OR circuit 11fd calculates a logical sum of the signal that is output from the setting latch 11fa and the signal that is output from the counter 11fb and then outputs an enable signal that is set to a calculation result. Specifically, when "High" signals are output from the setting latch 11fa and "High" and "Low" signals are alternately output from the counter 11fb, the OR circuit 11fd outputs a constant "High" signal as an enable signal in each cycle of a clock signal.

In contrast, when "Low" signals are output from the setting latch 11fa and "High" and "Low" signals are alternately output from the counter 11fb, the OR circuit 11fd outputs a "High" and "Low" signal alternately as an enable signal in each cycle of a clock signal.

When the signal that is output from the setting latch 11fa is "High", the OR circuit 11fd outputs constant "High" enable signals. When the signal that is output from the setting latch 11fa is "Low", the OR circuit 11fd outputs "High" and "Low" enable signals alternately. In this manner, the signal used when the 1τ-RAM is tested and the signal used when the 2τ-RAM is tested can be switched.

As described above, the enable signal generating circuit 11f outputs an enable signal in each one cycle of a clock signal when the 1τ-RAM is tested and outputs an enable signal in each two cycles of clock signals when the 2τ-RAM is tested. Thus, the IARRAY 11a, the DTGEN 11b, the RWGEN 11c, the ADGEN 11d, and the DCOUNT 11e can be operated in each one cycle of a clock signal when the 1τ-RAM is tested and operated in each two cycles of clock signals when the 2τ-RAM is tested.

Accordingly, the test pattern for causing the RAM 12 to operate in one cycle of a clock signal when the 1τ-RAM is tested can be generated and the test pattern for causing the RAM 12 to operate in two cycles of clock signals when the 2τ-RAM is tested can be generated, using one program in the RAM-BIST circuit 11.

Figure 4:
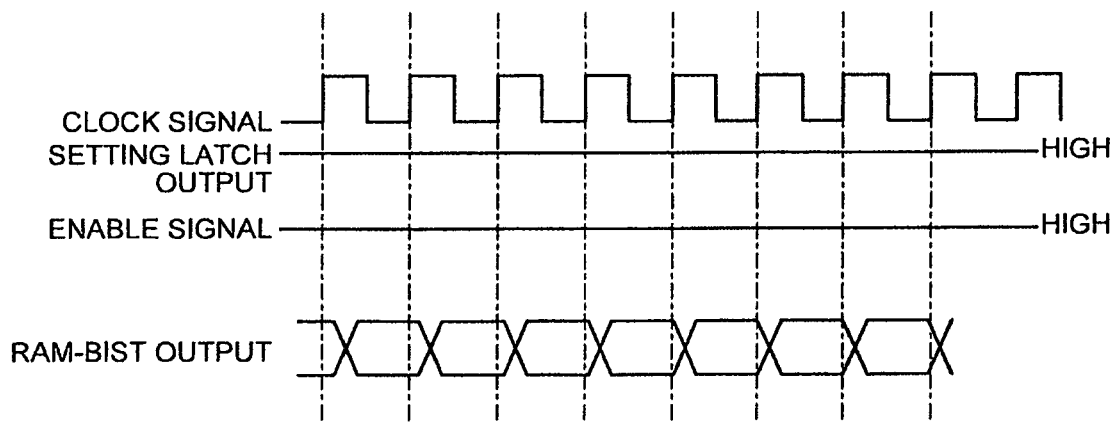
FIG. 4 is a time chart of a test pattern that is generated when a 1τ-RAM is tested.
Figure 5:
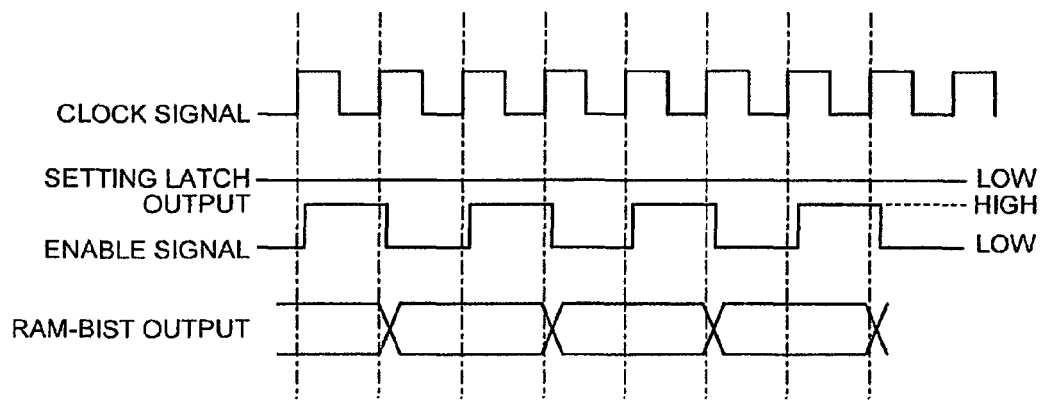
FIG. 5 is a time chart of a test pattern that is generated when a 2τ-RAM is tested.

The test patterns that are generated by the RAM-BIST circuit 11 are represented in FIGS. 4 and 5. FIG. 4 is a time chart of a test pattern generated when the 1τ-RAM is tested. FIG. 5 is a time chart of a test pattern generated when the 2τ-RAM is tested.

As represented in FIG. 4, "High" is set in the setting latch 11fa and constant "High" signals are output from the enable signal generating circuit 11f. As a result, the RAM-BIST circuit 11 generates a test pattern for causing the RAM 12 to operate in each one cycle of a clock signal.

In contrast, as represented in FIG. 5, when the 2τ-RAM is tested, "High" is set in the setting latch 11a, and a signal in which "High" and "Low" are switched in each cycle of a clock signal is output from the enable signal generating circuit 11f. As a result, the RAM-BIST circuit 11 generates a test pattern for causing the RAM 12 to operate in each two cycles of clock signals.

As described above, in the embodiment, the RAM-BIST circuit 11 receives a signal set to "High" or "Low" and a clock signal generated in a predetermined cycle, the RAM-BIST circuit 11 generates a test pattern for causing the memory of the RAM 12 to operate at each one cycle of a clock signal if the set value of the received signal is "High", and the RAM-BIST circuit 11 generates a test pattern for causing the memory of the RAM 12 at each two cycles of clock signals if the set value of the received signal is "Low". Therefore, even if memories that operate in different cycles are mounted, it is possible to generate test patterns in different cycles, using one program for generating a predetermined pattern and to test each of the memories without increasing the circuit scale.

In the embodiment, the RAM-BIST circuit 11 includes the counter 11fb, which outputs a signal set to "High" and a signal set to "Low" alternately and the OR circuit 11fd, which calculates, each time when a signal is output from the counter 11fb, a logical sum of the signal and a signal set to "High" or "Low", and which outputs an enable signal set to "High" or "Low", which is the calculation result. The RAM-BIST circuit 11 generates a test pattern for causing the memory in the RAM 12 to operate in each one cycle of a clock signal if the set value of the enable signal that is output from the OR circuit 11fd is "High", and the RAM-BIST circuit 11 generates a test pattern for causing the memory in the RAM 12 in each two cycles of clock signals if the set value of the enable signal that is output from the OR circuit 11fd is "Low". Therefore, even when memories that operate in different cycles are mounted on the RAM 12, each of the memories can be tested without a complex circuit.

In the embodiment, the RAM-BIST circuit 11 includes the setting latch 11fa that stores a "High" or "Low" set value and receives a signal to which the set value stored in the setting latch 11fa is set. By setting in the setting latch 11fa beforehand the set values corresponding to the cycles in which memories to be tested operate, a testing practitioner can select a test pattern to be generated.

In the embodiment, "High" or "Low" value is set in the setting latch 11fa. Alternatively, for example, a signal input unit, such as the LSI tester 20, outside the RAM-BIST circuit 11 may input a "High" or "Low" value when a test is performed. In this case, the signal input unit inputs a "High" signal when the 1τ-RAM is tested, and inputs a "Low" signal when the 2τ-RAM is tested. This further reduces the circuit scale of the RAM-BIST circuit 11.

In the embodiment, the DTRCV 13 is configured to perform a comparison to obtain a test result. Alternatively, the RAM-BIST circuit 11 and the DTRCV 13 may be integrated and the RAM-BIST circuit 11 may be configured to perform a comparison to obtain a test result.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A memory test circuit for receiving an input signal that is set to a first set value or a second set value and a clock signal that is generated in a predetermined cycle to test a memory which operates in one of first predetermined cycles and second predetermined cycles, the memory test circuit comprising:
    a counter circuit that outputs a set signal that is set to the first set value and a set signal that is set to the second set value alternately in a cycle of the clock signal;
    an OR circuit that calculates a logical sum of the set signal and the input signal each time when the set signal is output from the counter circuit and outputs a control signal indicating the logical sum of the set signal and the input signal; and
    a test pattern generation circuit that generates a test pattern for causing the memory to operate in the first predetermined cycles when the control signal is has a first transition pattern, and generates ea test pattern for causing the memory to operate in the second predetermined cycles when the control signal has a second transition pattern.

2. The memory test circuit according to claim 1, further comprising a latch circuit that stores therein the first set value or the second set value, wherein
    the input signal received in the OR circuit is a signal that is set to the set value stored in the latch circuit.

3. The memory test circuit according to claim 1, wherein
    the first predetermined cycle is equal to one cycle of the clock signal, and
    the second predetermined cycle is equal to two cycles of the clock signal.

4. A semiconductor integrated circuit, comprising:
    a memory which operates in one of first predetermined cycles and second predetermined cycles;
    a memory test circuit for receiving an input signal that is set to a first set value or a second set value and a clock signal that is generated in a predetermined cycle to test the memory;
    a counter circuit that outputs a set signal that is set to the first set value and a set signal that is set to the second set value alternately in a cycle of the clock signal;
    an OR circuit that calculates a logical sum of the set signal and the input signal each time when the set signal is output from the counter circuit and outputs a control signal indicating the logical sum of the set signal and the input signal; and a test pattern generation circuit that generates a test pattern for causing the memory to operate in the first predetermined cycles when the control signal has a first transition pattern, and generates a test pattern for causing the memory to operate in the second predetermined cycles when the control signal has a second transition pattern.

5. The semiconductor integrated circuit according to claim 4, wherein the first predetermined cycle is equal to one cycle of the clock signal, and the second predetermined cycle is equal to two cycles of the clock signal.

6. A method for testing a memory, comprising:

receiving an input signal that is set to a first set value or a second set value and a clock signal that is generated in a predetermined cycle;

generating a test pattern for causing the memory, which operates in one of first predetermined cycles and second predetermined cycles, to operate in the first predetermined cycles when a set value of the received input signal is the first set value and generating a test pattern for causing the memory to operate in the second predetermined cycles when the set value of the received input signal is the second set value; and testing the memory by causing the memory to operate in accordance with the generated test pattern.

7. The method according to claim 6, wherein the first predetermined cycle is equal to one cycle of the clock signal, and the second predetermined cycle is equal to two cycles of the clock signal.

8. A memory test circuit comprising:

an enable signal generation circuit that outputs a first enable signal or a second enable signal based on a clock signal having a first clock cycle;

a test pattern generation circuit that generates and inputs a test pattern to a memory, the test pattern generation circuit continuously outputting a first test pattern generated according to the first clock cycles when receiving the first enable signal as an input, and continuously outputting a second test pattern generated according to second clock cycles when receiving the second enable signal as an input, one clock cycle of the second clock cycles being equal to two clock cycles of the first clock cycles;

a result data storage unit that stores data on a result of a memory test generated as a result of operation of the memory, which operates in one of the first clock cycles and the second clock cycles according to the inputted test pattern, the enable signal generation circuit comprising a latch circuit that outputs a set fixed value as the first enable signal, a frequency dividing circuit that receives the clock signal having the first clock cycle and outputs a clock signal having the second clock cycle as the second enable signal, a logical sum calculating circuit that outputs, as the enable signal, a logical sum of the first enable signal output by the latch circuit and the second enable signal output by the frequency dividing circuit.

\* \* \* \* \*

UNITED STATES PATENT AND TRADEMARK OFFICE
CERTIFICATE OF CORRECTION

| | |
|---|---|
| PATENT NO. | : 8,412,983 B2 |
| APPLICATION NO. | : 12/585898 |
| DATED | : April 2, 2013 |
| INVENTOR(S) | : Keigo Nakatani |

It is certified that error appears in the above-identified patent and that said Letters Patent is hereby corrected as shown below:

In the Claims

Column 6, Line 41, In Claim 1, after "signal" delete "is".
Column 6, Line 42, In Claim 1, delete "ea" and insert -- a --, therefor.

Signed and Sealed this
Sixteenth Day of July, 2013

Teresa Stanek Rea
*Acting Director of the United States Patent and Trademark Office*